United States Patent
Chou et al.

(10) Patent No.: US 10,390,430 B1
(45) Date of Patent: Aug. 20, 2019

(54) PAD OF CIRCUIT BOARD

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Hou-Yuan Chou, New Taipei (TW); Yi-Chih Wu, New Taipei (TW)

(73) Assignees: HONGFUJIN PRECISION INDUSTRY (WUHAN) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/175,866

(22) Filed: Oct. 31, 2018

(30) Foreign Application Priority Data

Jun. 29, 2018 (CN) .......................... 2018 1 0698656

(51) Int. Cl.
*H05K 1/11* (2006.01)

(52) U.S. Cl.
CPC .............. *H05K 1/111* (2013.01); *H05K 1/115* (2013.01); *H05K 2201/099* (2013.01)

(58) Field of Classification Search
CPC ... H05K 1/111; H05K 1/115; H05K 2201/099
USPC .................. 174/263; 361/759, 767, 777–779
See application file for complete search history.

(56) References Cited

U.S. PATENT DOCUMENTS

| 3,610,811 A * | 10/1971 | O'Keefe | H05K 3/3452 |
| | | | 174/262 |
| 6,853,091 B2 * | 2/2005 | Miyajima | B23K 1/0016 |
| | | | 257/786 |
| 2001/0032388 A1 * | 10/2001 | Morris | H05K 1/112 |
| | | | 29/852 |

* cited by examiner

*Primary Examiner* — Sherman Ng
(74) *Attorney, Agent, or Firm* — ScienBiziP, P.C.

(57) ABSTRACT

A circuit board includes a board defining a holding slot and a connector. The connector includes a conductive column and a pad fixed to one end of the conductive column. The pad is received within the holding slot. The conductive column is fixed within the board. The pad is soldered to a connecting portion of an electrical component. The pad defines a first through hole receiving solder when the connecting portion of the electrical component is soldered to the pad.

9 Claims, 9 Drawing Sheets

PAD OF CIRCUIT BOARD

FIELD

The subject matter herein generally relates to circuit boards, and more particularly to a pad of a circuit board for soldering an electrical component to the circuit board.

BACKGROUND

Electronic devices include a circuit board and electronic components coupled to the circuit board. Current circuit boards generally use a pad which is soldered to a pin of the electronic component to establish electrical connection between the circuit board and the electronic component. As electronic devices and circuit boards become smaller, a connection between the pad and the pin may become weaker, thereby affecting performance of the electronic device.

BRIEF DESCRIPTION OF THE DRAWINGS

Implementations of the present disclosure will now be described, by way of example only, with reference to the attached figures.

DETAILED DESCRIPTION

Figure 1:
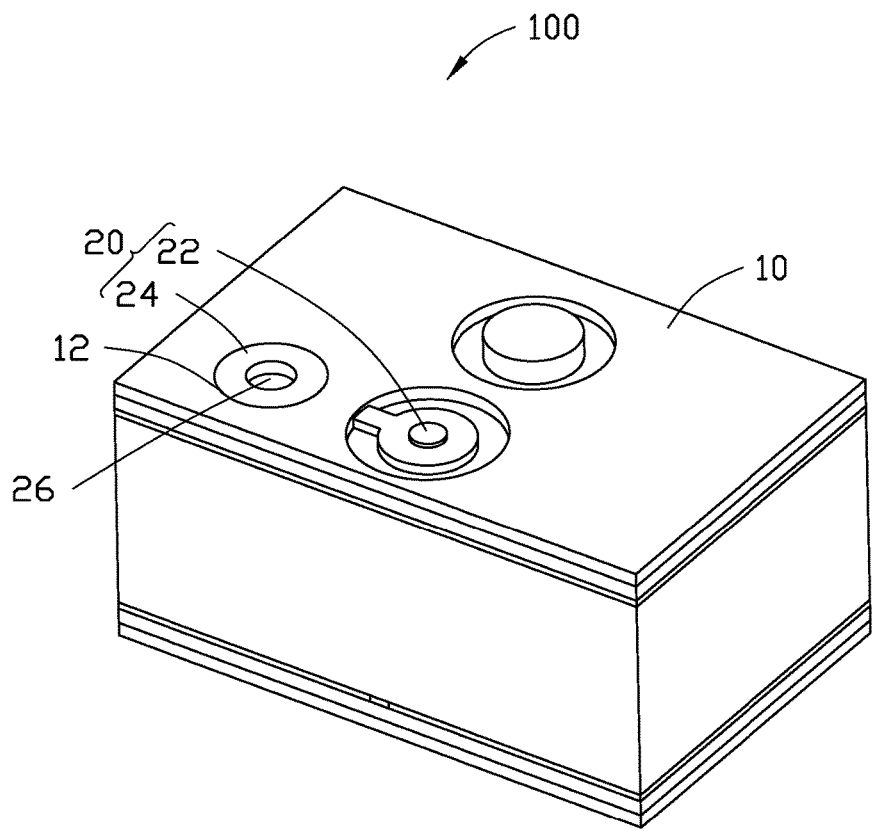
FIG. 1 is an assembled, isometric view of a circuit board in accordance with a first embodiment of the present disclosure.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

FIG. 1 illustrates an embodiment of a circuit board 100 including a board 10 and a connector 20. The board 10 defines a holding slot 12. The connector 20 includes a conductive column 22 and a pad 24 fixed to one end of the conductive column 22. The pad 24 is received within the holding slot 12. The conductive column 22 is fixed within the board 10. In at least one embodiment, the board 10 defines a receiving hole (not shown), and the conductive column 22 is received within the receiving hole. The pad 24 is soldered to a connecting portion (not shown) of an electronic component (not shown) and couples the electronic component to the circuit board 100. The connecting portion of the electronic component may be a pin, for example.

The pad 24 defines a first through hole 26. The first through hole 26 receives solder when the connecting portion of the electrical component is soldered to the pad 24. Since the solder flows into the first through hole 26 and solidifies onto an inner wall of the first through hole 26, a contact area between the solder and the pad 24 is increased, thereby increasing a connection strength between the solder and the pad 24 and preventing solder failure between the electronic component and the circuit board 100.

In at least one embodiment, the pad 24 is circular, and the first through hole 26 is circular and located in a center of the pad 24.

Figure 2:
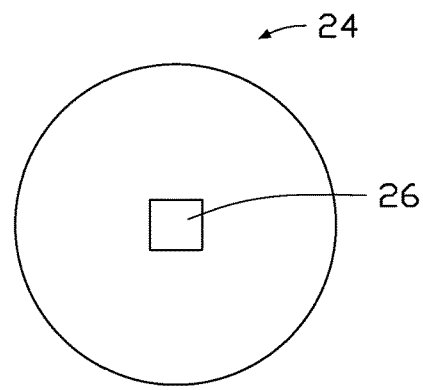
FIG. 2 is a diagram of a second embodiment of a pad of the circuit board in FIG. 1.

Referring to FIG. 2, in another embodiment, the first through hole 26 is square-shaped and defined in the center of the pad 24.

Figure 3:
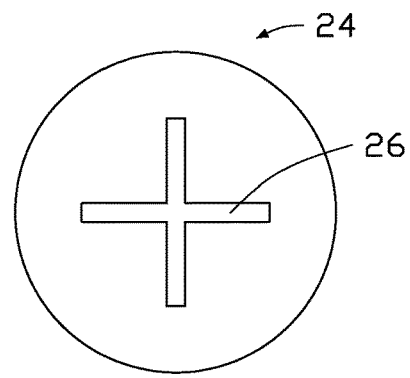
FIG. 3 is a diagram of a third embodiment of a pad of the circuit board in FIG. 1.

Referring to FIG. 3, in another embodiment, the first through hole 26 is cross-shaped and defined in a center of the pad 24.

Figure 4:
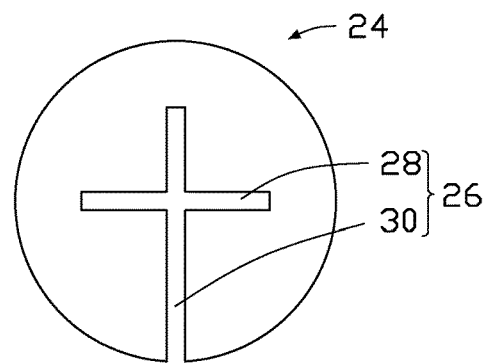
FIG. 4 is a diagram of a fourth embodiment of a pad of the circuit board in FIG. 1.

Referring to FIG. 4, in another embodiment, the first through hole 26 is cross-shaped including a first hole 28 and a second hole 30 intersecting with the first hole 28. One end of the second hole 30 extends to an edge of the pad 24.

Figure 5:
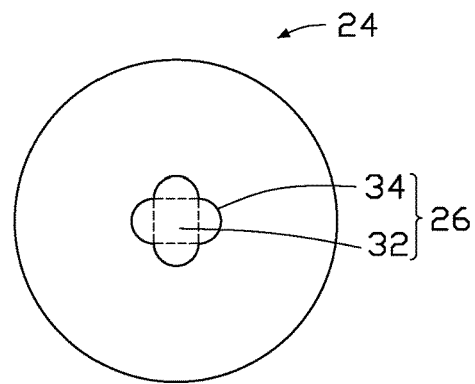
FIG. 5 is a diagram of a fifth embodiment of a pad of the circuit board in FIG. 1.

Referring to FIG. 5, in another embodiment, the pad 24 includes a square through hole 32 and four semicircular through holes 34 respectively connected to a corresponding side of the square through hole 32. The four semicircular through holes 34 surround the square through hole 32.

Figure 6:
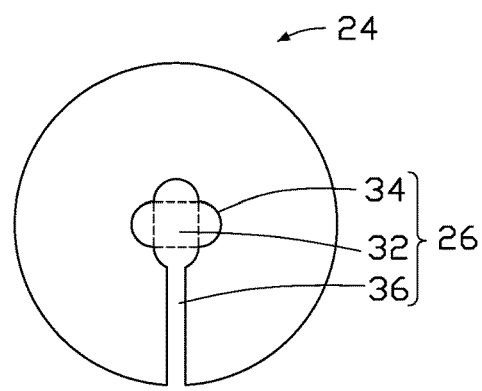
FIG. 6 is a diagram of a sixth embodiment of a pad of the circuit board in FIG. 1.

Referring to FIG. 6, in another embodiment, the first through hole 26 further includes a first elongated hole 36 extending from one of the semicircular through holes 34 to an edge of the pad 24.

Figure 7:
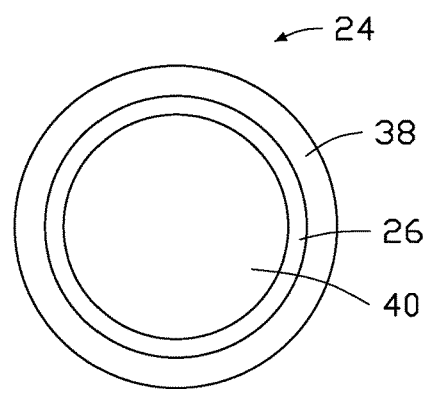
FIG. 7 is a diagram of a seventh embodiment of a pad of the circuit board in FIG. 1.

Referring to FIG. 7, in another embodiment, the pad 24 includes a first annular portion 38 and a circular portion 40 located within the first annular portion 38. The circular portion 40 is located in a center of the first annular portion 38. The first through hole 26 is defined between the first annular portion 38 and the circular portion 40.

Figure 8:
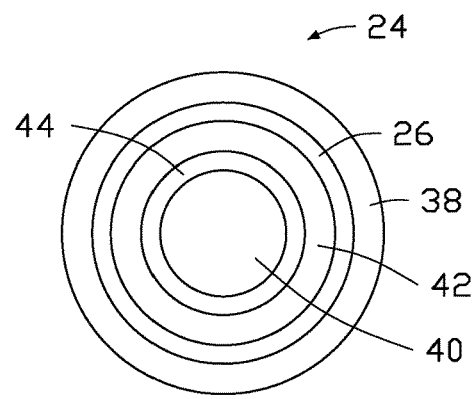
FIG. 8 is a diagram of an eighth embodiment of a pad of the circuit board in FIG. 1.

Referring to FIG. 8, in another embodiment, the pad 24 further includes a second annular portion 42 located within the first annular portion 38. The circular portion 40 is located in a center of the second annular portion 42. The first through hole 26 is defined between the first annular portion 38 and the second annular portion 42. The pad further defines a second through hole 44 between the second annular portion 42 and the circular portion 40.

Figure 9:
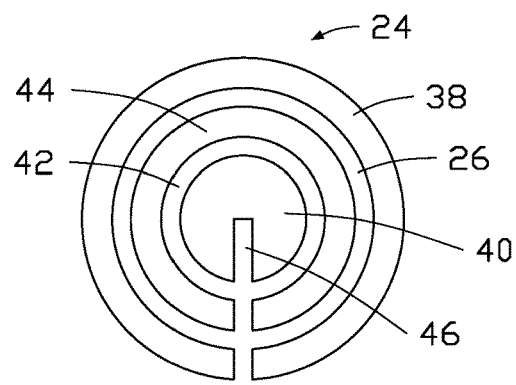
FIG. 9 is a diagram of a ninth embodiment of a pad of the circuit board in FIG. 1.

Referring to FIG. 9, in another embodiment, the pad 24 further defines a second elongated hole 46 extending from a center of the circular portion 40 to an outer edge of the first annular portion 38.

Figure 10:
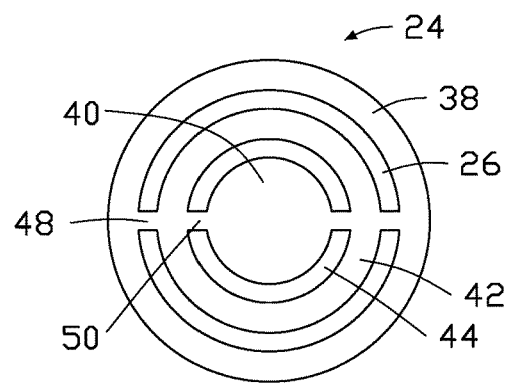
FIG. 10 is a diagram of a tenth embodiment of a pad of the circuit board in FIG. 1.

Referring to FIG. 10, in another embodiment based on the embodiment as disclosed in FIG. 8, the pad 24 further includes two first connecting portions 48 interconnecting the first annular portion 38 and the second annular portion 42. The pad 24 further includes two second connecting portions 50 interconnecting the second annular portion 42 and the circular portion 40. The two first connecting portions 48 and the two second connecting portions 50 are collinear with each other. The first connecting portions 48 divide the first through hole 26 into two first portions. The second connecting portions 50 divide the second through hole 44 into two second portions.

Figure 11:
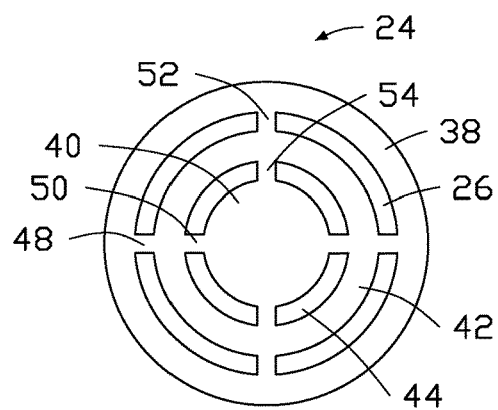
FIG. 11 is a diagram of an eleventh embodiment of a pad of the circuit board in FIG. 1.

Referring to FIG. 11, in another embodiment based on the embodiment as disclosed in FIG. 10, the pad 24 further includes two third connecting portions 52 interconnecting the first annular portion 38 and the second annular portion 42. The pad 24 further includes two fourth connecting portions 54 interconnecting the second annular portion 42 and the circular portion 40. The two third connecting portions 52 and the two fourth connecting portions 54 are collinear with each other. The second connecting portions 50 and the fourth connecting portions 54 are spaced 90 degrees apart from each other. Each third connecting portion 52 divides the corresponding first portion into two third portions. Each fourth connecting portion 54 divides the corresponding second portion into two fourth portions.

Figure 12:
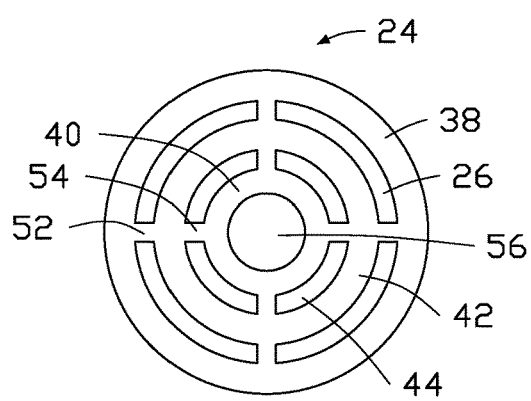
FIG. 12 is a diagram of a twelfth embodiment of a pad of the circuit board in FIG. 1.

Referring to FIG. 12, in another embodiment, the pad 24 further defines a third through hole 56 in a center of the circular portion 40. The third through hole 56 is circular.

Figure 13:
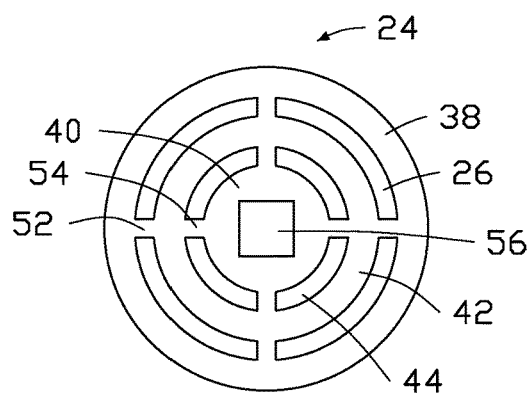
FIG. 13 is a diagram of a thirteenth embodiment of a pad of the circuit board in FIG. 1.

Referring to FIG. 13, in another embodiment, the third through hole 56 is square-shaped.

Figure 14:
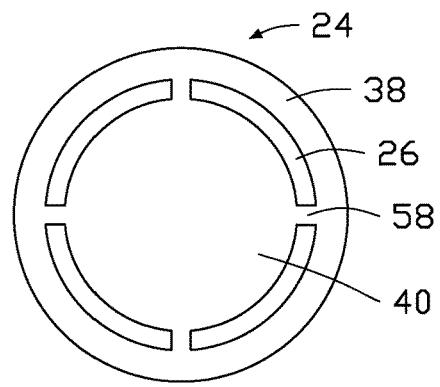
FIG. 14 is a diagram of a fourteenth embodiment of a pad of the circuit board in FIG. 1.

Referring to FIG. 14, in another embodiment based on the embodiment as disclosed in FIG. 7, the pad 24 further includes four interconnecting portions 58, the interconnecting portions 58 interconnecting the first annular portion 38 and the circular portion 40. The four interconnecting portions 58 are equally spaced apart from each other and divide the first through hole 26 into four portions.

Figure 15:
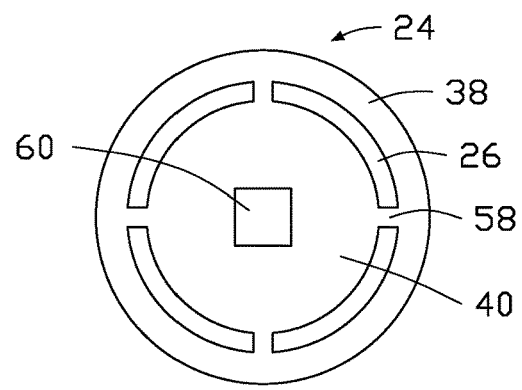
FIG. 15 is a diagram of a fifteenth embodiment of a pad of the circuit board in FIG. 1.

Referring to FIG. 15, in another embodiment, the pad 24 further defines a fourth through hole 60 in a center of the circular portion 40. The fourth through hole 60 is square-shaped.

Figure 16:
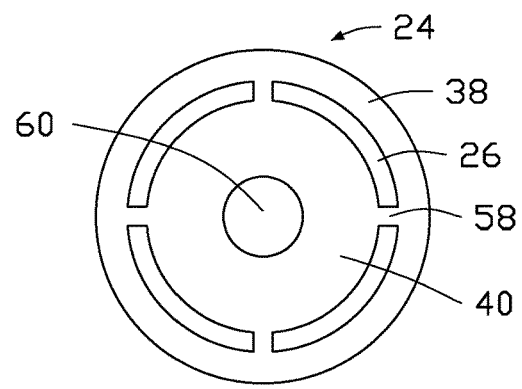
FIG. 16 is a diagram of a sixteenth embodiment of a pad of the circuit board in FIG. 1.

Referring to FIG. 16, in another embodiment, the fourth through hole 60 is circular.

Figure 17:
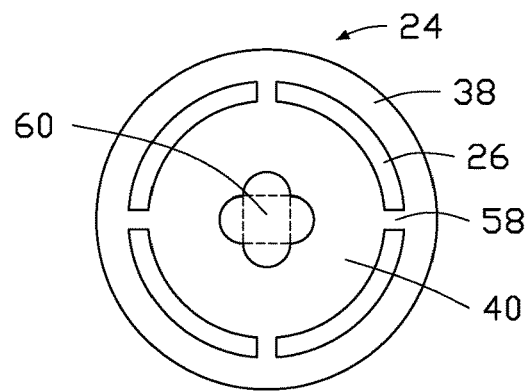
FIG. 17 is a diagram of a seventeenth embodiment of a pad of the circuit board in FIG. 1.

Referring to FIG. 17, in another embodiment, the fourth through hole 60 includes a square portion and four semicircular portions respectively connected to a corresponding side of the square portion. The square portion of the fourth through hole 60 is located in a center of the circular portion 40. The four semicircular portions surround the square portion.

Figure 18:
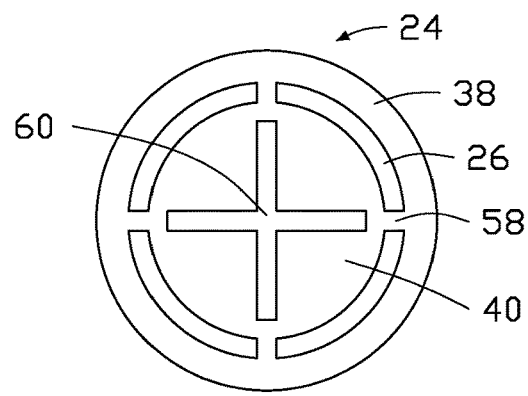
FIG. 18 is a diagram of an eighteenth embodiment of a pad of the circuit board in FIG. 1.

Referring to FIG. 18, in another embodiment, the fourth through hole 60 is cross-shaped.

Figure 19:
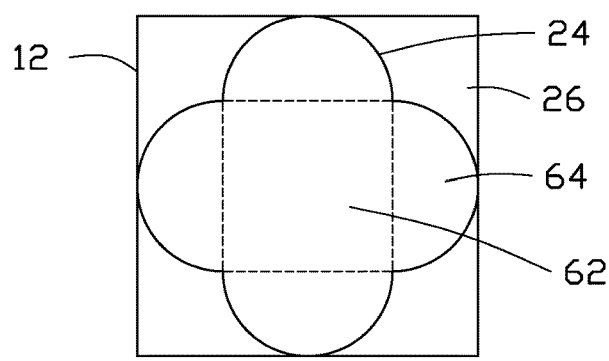
FIG. 19 is a diagram of a nineteenth embodiment of a pad of the circuit board in FIG. 1.

Referring to FIG. 19, in another embodiment, the pad 24 includes a first body 62 and four second bodies 64 respectively protruding from a corresponding side of the first body 62. The holding slot 12 is circular. The first through hole 26 is defined between an edge of the holding slot 12 and the pad 24.

Figure 20:
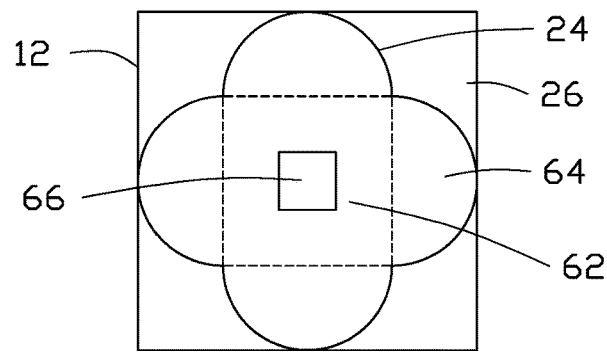
FIG. 20 is a diagram of a twentieth embodiment of a pad of the circuit board in FIG. 1.

Referring to FIG. 20, in another embodiment, a fifth through hole 66 is defined in a center of the pad 24. The fifth through hole 66 is square-shaped.

Figure 21:
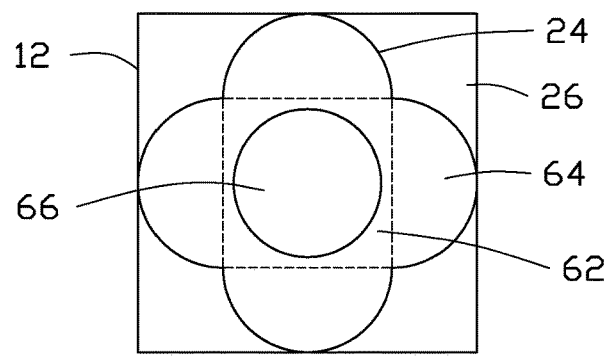
FIG. 21 is a diagram of a twenty-first embodiment of a pad of the circuit board in FIG. 1.

Referring to FIG. 21, in another embodiment, the fifth through hole 66 is circular-shaped.

Figure 22:
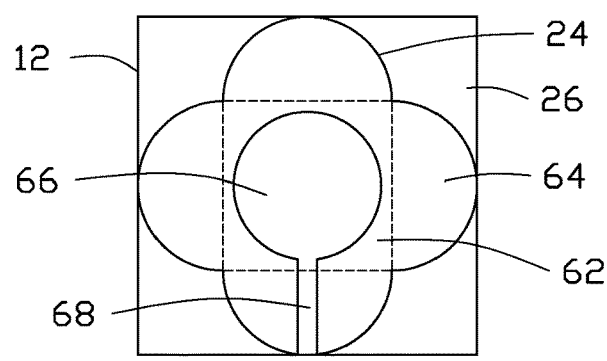
FIG. 22 is a diagram of a twenty-second embodiment of a pad of the circuit board in FIG. 1.

Referring to FIG. 22, in another embodiment, the pad 24 further defines a third elongated hole 68 extending from an outer edge of the pad 24 to the fifth through hold 66.

Figure 23:
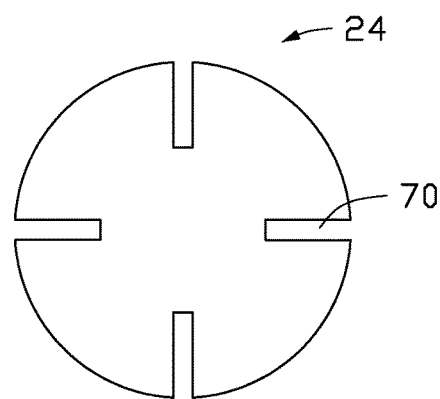
FIG. 23 is a diagram of a twenty-third embodiment of a pad of the circuit board in FIG. 1.

Referring to FIG. 23, in another embodiment, the pad 24 is circular-shaped. Instead of having the first through hole 26, four indented holes 70 are defined and spaced apart and arranged around a periphery of the pad 24. The four indented holes 70 are spaced 90 degrees apart from each other.

Figure 24:
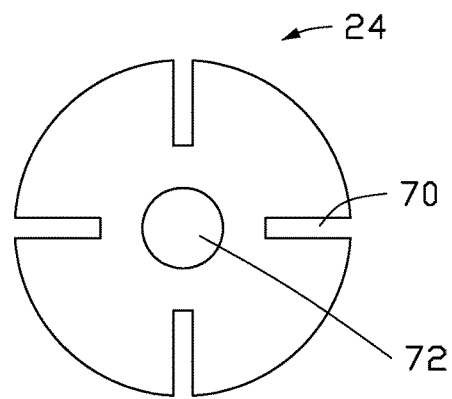
FIG. 24 is a diagram of a twenty-fourth embodiment of a pad of the circuit board in FIG. 1.

Referring to FIG. 24, in another embodiment, the pad 24 defines a circular through hole 72 in a center of the pad 24.

Figure 25:
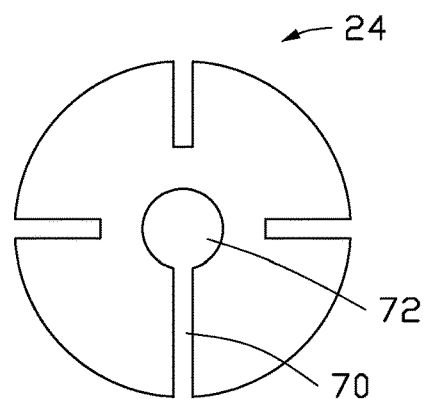
FIG. 25 is a diagram of a twenty-fifth embodiment of a pad of the circuit board in FIG. 1.

Referring to FIG. 25, in another embodiment, one of the four indented holes 70 extends to the circular through hole 72.

The pad 24 of the circuit board 100 defines the first through hole 26. When the connecting portion of the electronic component is soldered, a contact area between the solder and the pad 24 is increased, thereby increasing a connection strength between the electronic component and the circuit board 100 and increasing a soldering yield.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A circuit board comprising:
a board defining a holding slot; and
a connector comprising:
a conductive column; and
a pad fixed to one end of the conductive column, wherein:

the pad is received within the holding slot;
the conductive column is fixed within the board;
the pad is soldered to a connecting portion of an electrical component;
the pad defines a first through hole, the first through hole receives solder when the connecting portion of the electrical component is soldered to the pad; and
the pad comprises a square-shaped first body and four semicircular-shaped second bodies respectively protruding from a corresponding side of the first body; the holding slot is circular; the first through hole is defined between an edge of the holding slot and the pad.

2. The circuit board of claim 1, wherein the pad is circular, and the first through hole is circular and defined in a center of the pad.

3. The circuit board of claim 1, wherein the pad is circular, and the first through hole is cross-shaped and defined in a center of the pad.

4. The circuit board of claim 3, wherein the cross-shaped first through hole comprises a first hole and a second hole intersecting each other; one end of the second hole extends to an edge of the pad.

5. The circuit board of claim 1, wherein the pad comprises a first annular portion and a circular portion located within the first annular portion; the first through hole is defined between the first annular portion and the circular portion.

6. The circuit board of claim 5, wherein the pad further comprises a second annular portion located within the first annular portion; the circular portion is located within the second annular portion; the pad further defines a second through hole between the second annular portion and the circular portion.

7. The circuit board of claim 6, wherein the pad further defines an elongated hole extending from an outer edge of the first annular portion to a center of the circular portion.

8. The circuit board of claim 1, wherein the pad is circular, the first through hole comprises four indented holes spaced 90 degrees apart from each other around an outer edge of the pad.

9. The circuit board of claim 8, wherein the pad further defines a circular through hole in a center of the pad, the circular through hole being connected to one of the four indented holes.

* * * * *